US009777966B2

(12) United States Patent
Chan et al.

(10) Patent No.: US 9,777,966 B2
(45) Date of Patent: Oct. 3, 2017

(54) SYSTEM FOR COOLING HEAT GENERATING ELECTRICALLY ACTIVE COMPONENTS FOR SUBSEA APPLICATIONS

(71) Applicant: General Electric Company, Schenectady, NY (US)

(72) Inventors: Mark Aaron Chan Chan, Munich (DE); Stefan Schroeder, Munich (DE); Piniwan Thiwanka Bandara Wijekoon, Munich (DE); Eric Ayres Browne, Latham, NY (US)

(73) Assignee: General Electric Company, Niskayuna, NY (US)

( * ) Notice: Subject to any disclaimer, the term of this patent is extended or adjusted under 35 U.S.C. 154(b) by 221 days.

(21) Appl. No.: 14/168,206

(22) Filed: Jan. 30, 2014

(65) Prior Publication Data

US 2015/0216080 A1    Jul. 30, 2015

(51) Int. Cl.
*H05K 7/20*    (2006.01)
*F28D 15/02*   (2006.01)

(52) U.S. Cl.
CPC ......... *F28D 15/02* (2013.01); *H05K 7/20236* (2013.01); *H05K 7/20927* (2013.01)

(58) Field of Classification Search
CPC ........................... F28D 15/02; H05K 7/20927; H05K 7/20236; H05K 7/20336
See application file for complete search history.

(56) References Cited

U.S. PATENT DOCUMENTS 6,145,584 A    11/2000 Baynes et al.
7,424,917 B2 *  9/2008 Martin .................... B63C 11/52
                                                166/319
(Continued)

FOREIGN PATENT DOCUMENTS

DE    EP 2487326 A1 *  8/2012  ......... E21B 41/0007
EP       2354547 A1     8/2011
(Continued)

OTHER PUBLICATIONS

Hernes, M.; Pittini, Riccardo, "Enabling pressure tolerant power electronic converters for subsea applications," Power Electronics and Applications, 2009. EPE '09. 13th European Conference on , vol., No., pp. 1,10, Sep. 8-10, 2009.

(Continued)

*Primary Examiner* — Jerry Wu
*Assistant Examiner* — Stephen Sul
(74) *Attorney, Agent, or Firm* — Pabitra K. Chakrabarti

(57) ABSTRACT

A subsea power module includes an outer pressure compensated vessel defining an interior chamber and one or more heat generating electrical components disposed within the interior chamber. The outer pressure compensated vessel is configured to maintain a pressure within the interior chamber substantially the same as an ambient pressure outside the outer pressure compensated vessel. Each of the electrical components may be disposed within an inner chamber of a pressure vessel disposed within the interior chamber of the outer pressure compensated vessel. Each of the one or more heat generating electrical components is configured to transfer heat generated within the interior chamber of the outer pressure compensated vessel through the wall defining the interior chamber to a fluid, such as seawater, surrounding the outer pressure compensated vessel.

9 Claims, 5 Drawing Sheets

(56) References Cited

U.S. PATENT DOCUMENTS

| | | |
|---|---|---|
| 7,770,394 B2 | 8/2010 | Beck |
| 8,324,748 B2 | 12/2012 | Thackston |
| 2009/0097207 A1 | 4/2009 | Gough |
| 2010/0139544 A1* | 6/2010 | Bo ................... B63G 8/08 114/337 |
| 2011/0019385 A1 | 1/2011 | Biester et al. |
| 2011/0192573 A1 | 8/2011 | Defretin et al. |
| 2011/0252880 A1* | 10/2011 | Hama ................ F03B 13/148 73/170.29 |
| 2012/0155028 A1 | 6/2012 | Stokes |
| 2012/0314373 A1 | 12/2012 | Park |
| 2013/0167962 A1* | 7/2013 | Skjetne ............... F16L 55/04 138/30 |
| 2013/0175958 A1 | 7/2013 | McJunkin et al. |
| 2014/0098468 A1* | 4/2014 | Boe .................... H02G 1/10 361/601 |
| 2014/0262457 A1* | 9/2014 | Katkar ................ H05K 1/09 174/257 |
| 2015/0188297 A1* | 7/2015 | Boe .................... H01F 27/14 174/564 |
| 2016/0212883 A1* | 7/2016 | Kristensen ........ E21B 41/0007 |

FOREIGN PATENT DOCUMENTS

| | | |
|---|---|---|
| EP | 2487326 A1 | 8/2012 |
| EP | 2487327 A2 | 8/2012 |
| EP | 2467005 A1 | 12/2012 |
| WO | 0113692 A1 | 2/2001 |
| WO | 2006019307 A1 | 2/2006 |
| WO | 2009075975 A1 | 6/2009 |
| WO | 2009156710 A2 | 12/2009 |
| WO | 2011100064 A2 | 8/2011 |
| WO | 2013029916 A2 | 3/2013 |
| WO | 2013036132 A2 | 3/2013 |

OTHER PUBLICATIONS

Kvien, O.; Berg, G.; Hvidsten, S., "Material erosion and build-up at the high voltage electrode during PD testing of subsea insulation materials using a modified Cigré II test method," Electrical Insulation and Dielectric Phenomena (CEIDP), 2011 Annual Report Conference on , vol., No., pp. 448,451, Oct. 16-19, 2011.

* cited by examiner

SYSTEM FOR COOLING HEAT GENERATING ELECTRICALLY ACTIVE COMPONENTS FOR SUBSEA APPLICATIONS

BACKGROUND

Embodiments of the subject matter disclosed herein generally relate to systems and apparatuses useable in subsea installations for cooling of heat generating electrical components.

During the past few years, with the increase in price of fossil fuels, the interest in developing new production fields has dramatically increased. However, the availability of land-based production fields is limited. Thus, the industry has now extended drilling to offshore locations, which appear to hold a vast amount of fossil fuel. As oil and gas fields in shallow waters diminish, producers are tapping offshore fields in deeper waters with oil installations that operate far below the surface of the sea. The typical equipment for such subsea oil recovery and production include various above-water and subsea heat generating electrical components, such as gas compressors and various pumps for multiple functions. In many instances, electric variable speed drive (VSD), motor systems, power transformers, uninterruptible power supply, and circuit breaker are examples of such subsea heat generating electrical components.

Typically, alternating current (AC) transmission and distribution systems are used for delivery of power to these subsea heat generating electrical component locations. Such systems typically deliver AC power from a platform or terrestrial location to the subsea heat generating electrical components through a large power cable. The electrical components in the subsea locations generally cannot tolerate high pressures and must be placed in large, thick walled pressure vessels capable of withstanding the high pressures present at various depths of water while maintaining a substantially constant pressure within the pressure vessel. In addition, cooling of these subsea heat generating electrical components is important to secure a reliable production and processing of oil and gas in subsea locations.

In a typical subsea electrical component cooling system, electrical components are immersed in an outer vessel filled with a dielectric oil. This allows for electrical insulation between electrical components and cooling is achieved by the natural convection of the oil. However natural convection cooling of these components is a thermal bottleneck and takes more than 30% of the overall thermal resistance of the system. Accordingly, a cooling concept is desired that allows these heat generating electrical components, to be more effectively cooled, while maintaining electrical isolation from the sea water and its neighboring components.

BRIEF DESCRIPTION

These and other shortcomings of the prior art are addressed by the present disclosure, which provides a subsea power module and system for cooling of a heat generating pressure vessel, included as a part of an offshore oil and gas installation assembly.

In accordance with an embodiment, provided is a subsea power module. The subsea power module including an outer pressure compensated vessel comprising a wall defining an interior chamber and one or more pressure vessels disposed within the interior chamber of the outer pressure compensated vessel and coupled to an interior surface of the wall defining the interior chamber of the outer pressure compensated vessel. The outer vessel pressure vessel is configured to maintain a pressure within the interior chamber substantially the same as an ambient pressure outside the outer pressure compensated vessel. The one or more pressure vessels including an interior chamber configured to maintain a substantially constant pressure within the interior chamber of the pressure vessel. The one or more pressure vessels further including one or more heat generating electrical components disposed within the interior chamber of the pressure vessel.

In accordance with another embodiment, provided is a system for cooling of a heat generating pressure vessel for subsea applications. The system including a subsea power module including an outer pressure compensated vessel and one or more heat generating pressure vessels. The outer pressure compensated vessel including a wall defining an interior chamber and a dielectric oil that substantially fills the interior chamber of the outer pressure compensated vessel. The outer pressure compensated vessel is configured to maintain a pressure within the interior chamber substantially the same as an ambient pressure outside the outer pressure compensated vessel. The one or more heat generating pressure vessels is disposed within the interior chamber of the outer pressure compensated vessel and coupled to an interior surface of the wall defining the interior chamber of the outer pressure compensated vessel. Each of the heat generating pressure vessel including an interior chamber and one or more heat generating electrical components. Each of the interior chambers configured to maintain a substantially constant pressure within the interior chamber of the heat generating pressure vessel. The one or more heat generating electrical components is disposed within the interior chamber of the heat generating pressure vessel.

In accordance with yet another embodiment, provided is an offshore oil and gas installation assembly. The assembly including one or more subsea power modules housing therein one or more heat generating electrical components. Each of the one or more subsea power modules including an outer pressure compensated vessel having a wall defining an interior chamber. The outer pressure compensated vessel is configured to maintain a pressure within the interior chamber substantially the same as an ambient pressure outside the outer pressure compensated vessel. The one or more heat generating electrical components is disposed within the interior chamber and coupled to the wall defining the interior chamber. Each of the one or more heat generating electrical components is configured to transfer heat generated within the interior chamber of the outer pressure compensated vessel through the wall defining the interior chamber to a seawater surrounding the outer pressure compensated vessel.

Other objects and advantages of the present disclosure will become apparent upon reading the following detailed description and the appended claims with reference to the accompanying drawings.

DRAWINGS

These and other features, aspects, and advantages of the present disclosure will become better understood when the following detailed description is read with reference to the accompanying drawings in which like characters represent like parts throughout the drawings, wherein.

Figure 6:
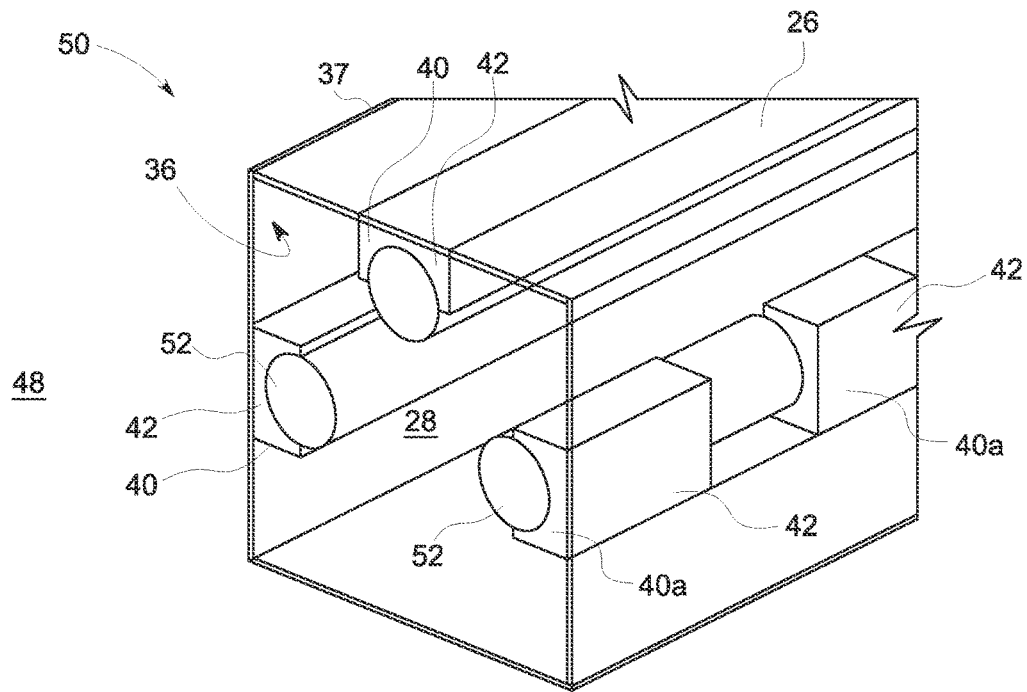
FIG. 6 is a schematic orthogonal view of another exemplary subsea power module including one or more pressure vessels housing heat generating electrical components therein, in accordance with one or more embodiments shown or described herein.
Figure 7:
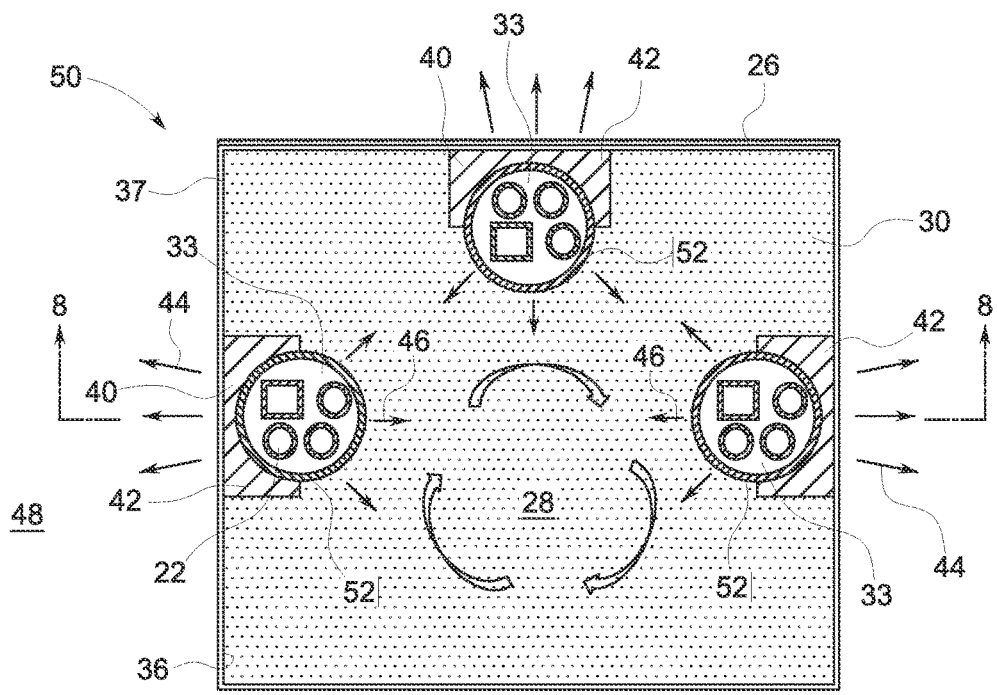
FIG. 7 is a schematic cross-section plan view of a portion of the subsea power module of FIG. 6, in accordance with one or more embodiments shown or described herein.
Figure 8:
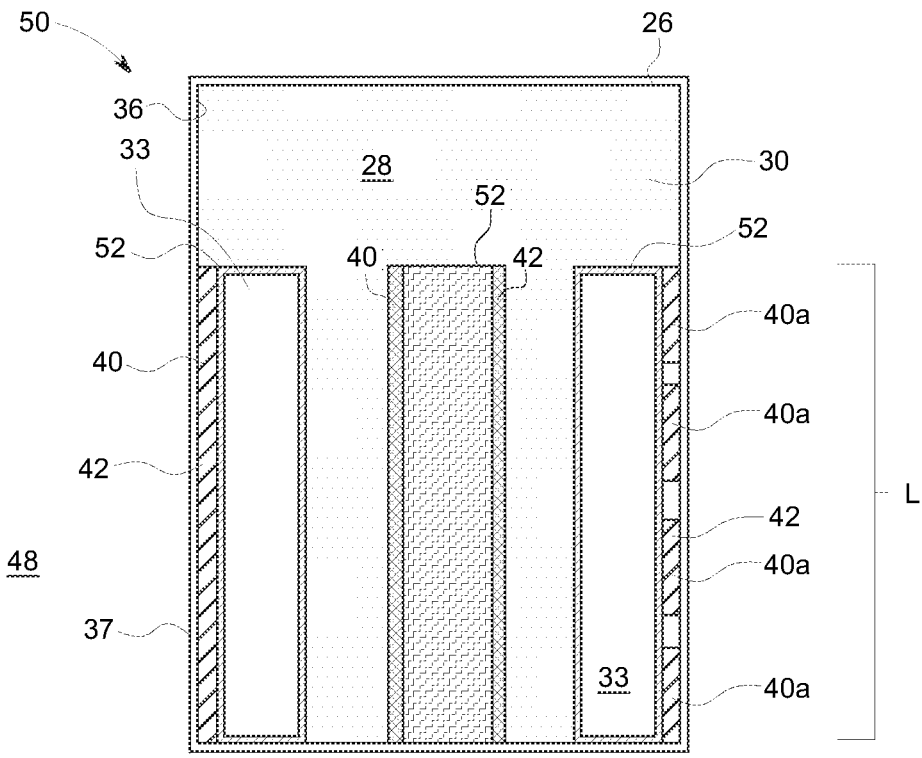
Figure 9:
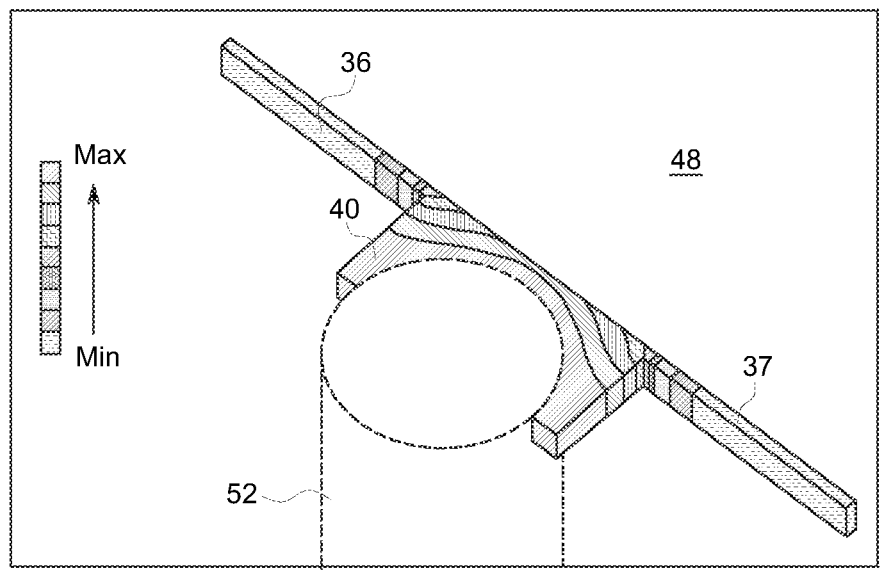

FIG. 8 is a schematic cross-section taken along line 8-8 of FIG. 7 of a portion of the subsea power module of FIG. 6, in accordance with one or more embodiments shown or described herein; and FIG. 9 is a schematic partial cross-section orthogonal view illustrating a portion of an electrically isolative material disposed between a pressure vessel and wall of an outer pressure compensated vessel and a thermal response, in accordance with one or more embodiments shown or described herein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

The present disclosure will be described for the purposes of illustration only in connection with certain embodiments; however, it is to be understood that other objects and advantages of the present disclosure will be made apparent by the following description of the drawings according to the disclosure. While preferred embodiments are disclosed, they are not intended to be limiting. Rather, the general principles set forth herein are considered to be merely illustrative of the scope of the present disclosure and it is to be further understood that numerous changes may be made without straying from the scope of the present disclosure.

Preferred embodiments of the present disclosure are illustrated in the figures with like numerals being used to refer to like and corresponding parts of the various drawings. It is also understood that terms such as "top", "bottom", "outward", "inward", and the like are words of convenience and are not to be construed as limiting terms. It is to be noted that the terms "first," "second," and the like, as used herein do not denote any order, quantity, or importance, but rather are used to distinguish one element from another. The terms "a" and "an" do not denote a limitation of quantity, but rather denote the presence of at least one of the referenced item. Accordingly, the singular forms "a", "an", and "the" include plural references unless the context clearly dictates otherwise. The modifier "about" used in connection with a quantity is inclusive of the stated value and has the meaning dictated by the context (e.g., includes the degree of error associated with measurement of the particular quantity). "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure relate to system for cooling heat generating electrical components for subsea applications. More particularly, embodiments of this disclosure relate to a modular, subsea, power module having disposed therein heat generating electrical components and the integrated cooling of such components. The exemplary embodiments may, amongst other benefits, reduce system complexity, facilitate improved cooling, reduce total system weight, increase power rating, efficiency, reliability and lifetime of the electronics and provide for a more compact subsea installation.

The following description refers to the accompanying drawings, in which, in the absence of a contrary representation, the same numbers in different drawings represent similar elements.

Figure 1:
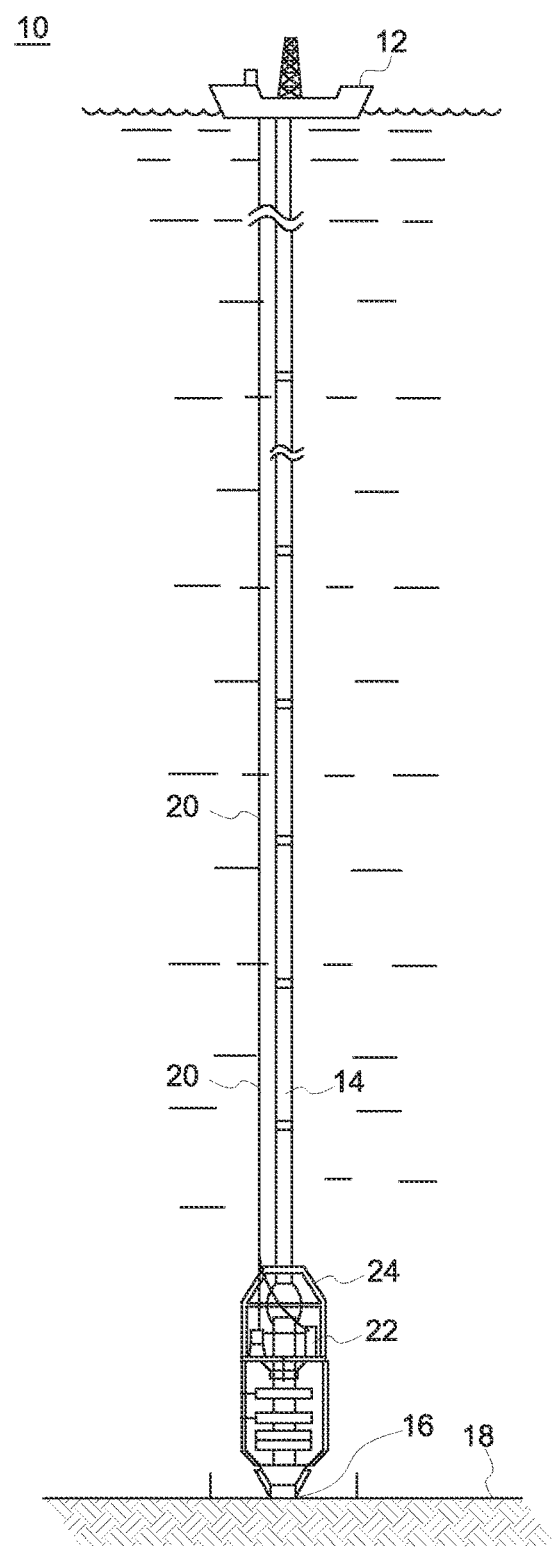
FIG. 1 is a schematic diagram of an offshore drilling assembly including a cooled subsea power module, in accordance with one or more embodiments shown or described herein.

Referring now to the drawings, a traditional offshore oil and gas installation assembly 10, as illustrated in FIG. 1, includes a platform 12 (of any other type of vessel at the water surface) connected via a riser 14 to a wellhead 16 on the seabed 18. It is noted that the elements shown in FIG. 1 are not drawn to scale and no dimensions should be inferred from relative sizes and distances illustrated in FIG. 1. Electrical cables and/or hydraulic lines 20 transport electrical signals from the drilling platform 12 to one or more subsea heat generating electrical components, generally designated 22, located close to the seabed 18. In an embodiment, the electrical components 22 may include insulative properties, such as a built in insulation, so as to be heat generating, but having zero voltage against ground, and thus not deemed electrically active. In another embodiment, the electrical components 22 do not include any built in insulative properties and are thus both heat generating and electrically active.

In an embodiment, the subsea heat generating electrical components 22 are disposed within a subsea power module 24. In the illustrated embodiment, assembly 10 includes a single subsea power module 24. In other embodiments, assembly 10 may include additional subsea power modules 24. The number of subsea power modules 24 is generally selected based on the number and size of loads.

Referring now to FIGS. 2-8, illustrated are exemplary subsea power modules, according to various embodiments, for use in assembly 10 (shown in FIG. 1). Referring more specifically to FIGS. 2-5, illustrated are various embodiments including a subsea power module 24 according to this disclosure. The subsea power module 24 includes an outer pressure compensated vessel 26 defining an interior chamber 28. The outer pressure compensated vessel 26 is configured as a pressure compensated enclosure capable of withstanding subsea pressures (e.g. 300 bar). In an embodiment, the subsea power module 24 is configured for use at a depth of approximately 1000 meters, at which depth the ambient pressure around the subsea power module 24 is about 10,000 kilopascals. The outer pressure compensated vessel 26 is configured to maintain substantially the same pressure within interior chamber 28 as the pressure outside the outer pressure compensated vessel 26. In an exemplary embodiment, free space, and more specifically, space not occupied by components, such as a heat generating pressure vessel(s), described presently, disposed within the interior chamber 28, is filled with an oil, and more particularly, a dielectric oil 30. Alternatively, the interior chamber may be filled with any suitable material that permits the outer pressure compensated vessel 26 to function substantially as described herein. The subsea power module 24 further includes one or more heat generating pressure vessels 32 disposed within the interior chamber 28 of the outer pressure compensated vessel 26. Each of the one or more pressure vessels 32 defining an interior chamber 33 therein. The one or more pressure vessels 32 are configured to maintain a substantially constant pressure (e.g., about 101.325 kilopascals) in their respective interior chamber 33 regardless of the ambient pressure outside the outer pressure compensated vessel 26. The one or more pressure vessels 32 housing therein the electrical components 22. In the exemplary embodiment, the electrical components 22 may include, but are not limited to, capacitor banks, inductors, resistors, and high power electronics. In an embodiment, the electrical components 22, and more particularly, the heat generating device(s), are not in physical contact with an interior surface of the pressure vessel 32.

Each subsea power module 24 includes the outer pressure compensated vessel 26 defining the interior chamber 28 and configured to maintain a substantially constant pressure within the interior chamber 28 of the outer pressure compensated vessel 26 without regard to the ambient pressure outside of the outer pressure compensated vessel 26. In a particular embodiment, the outer pressure compensated vessel 26 is configured to maintain the pressure in the interior chamber 28 the same as the ambient pressure surrounding the outer pressure compensated vessel 26. Further illustrated in FIGS. 2-5 is the inclusion of a pressure compensator 34 configured as a part of the outer pressure compensated vessel 26. The pressure compensator 34 balances the pressure between the interior chamber 28 and the surroundings of the outer pressure compensated vessel 26 by having an expandable and contractible medium (e.g. bellow) in fluid communication with the interior chamber 28.

Figure 2:
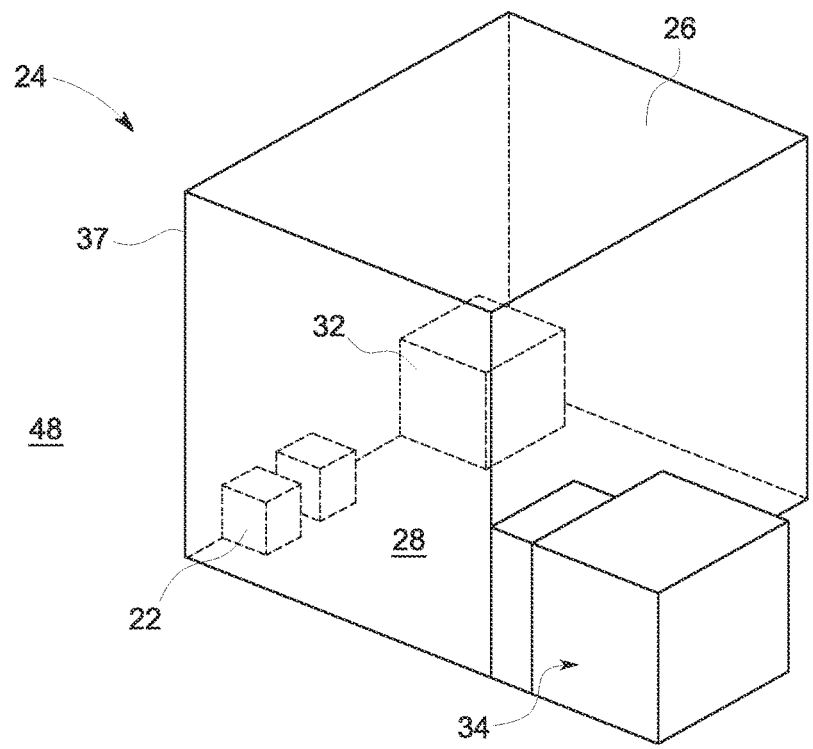
FIG. 2 is a schematic orthogonal view of an exemplary subsea power module including one or more pressure vessels housing heat generating electrical components therein, in accordance with one or more embodiments shown or described herein.
Figure 3:
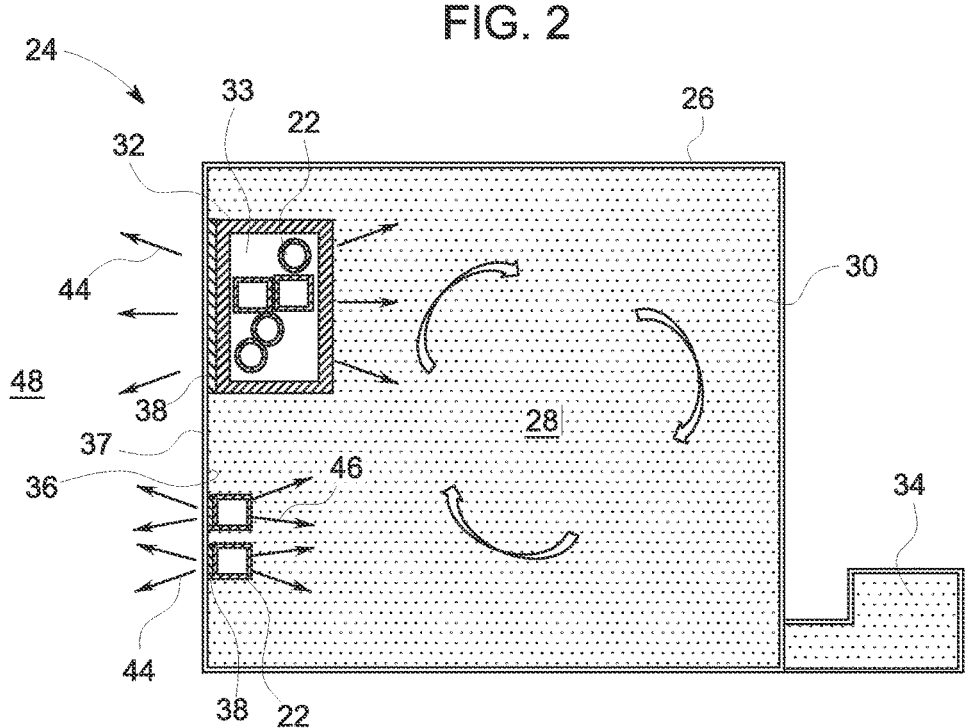
FIG. 3 is a schematic cross-section plan view of a portion of the subsea power module of FIG. 2, in accordance with one or more embodiments shown or described herein.

The subsea power module 24 as disclosed herein, includes a passive cooling system. More particularly, referring again to FIGS. 2-4, illustrated is a first embodiment of the subsea power module 24 in which the one or more pressure vessels 32 is coupled to an interior surface 36 of a wall 37, via a heat spreader (described presently), that defines the outer pressure compensated vessel 26. In another embodiment, as also illustrated in FIGS. 2 and 3, the subsea heat generating electrical components 22 are not housed within a pressure vessel, such as the one or more pressure vessels 32, and coupled to the interior surface 36 of the wall 37, via a heat spreader (described presently), defining the outer pressure compensated vessel 26. The coupling of the one or more pressure vessels 32 or electrical components 22, to the interior surface 36 of wall 37 defining the outer pressure compensated vessel 26 provides improved cooling for the electrical components 22 and the overall subsea power module 24. In the embodiments illustrated in FIGS. 2-4, the electrical components are configured to include insulative properties and are thus heat generating only. The heat spreader 38 provides for dissipation of the heat generated by these components as described presently.

Figure 4:
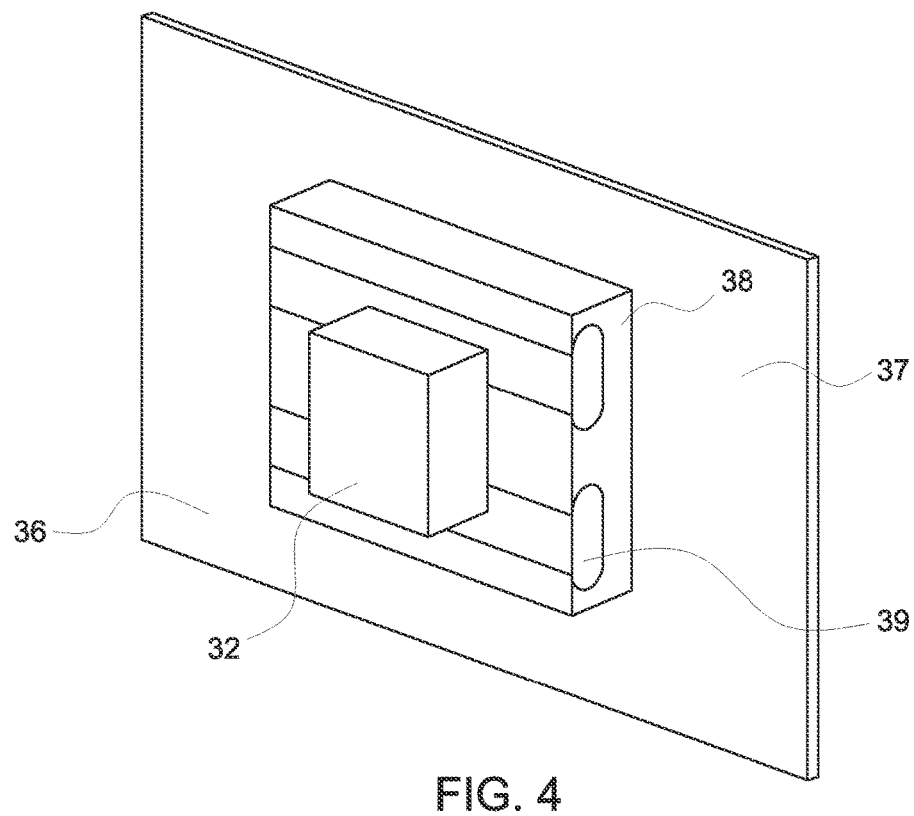
FIG. 4 is a schematic orthogonal view of a portion of the subsea power module of FIG. 2, in accordance with one or more embodiments shown or described herein.

To provide the passive cooling for the electrically insulated electrical components 22, the one or more pressure vessels 32 include thermally conductive walls such that heat 44 generated within each of the one or more pressure vessels 32 may be conducted through the walls of the pressure vessel 32, through a heat spreader 38 disposed between the pressure vessel 32 and the interior surface 36 of the wall 37. Referring more specifically to FIG. 4, illustrated is a portion of the wall 37 of the subsea power module 24 of FIG. 2, illustrating the heat spreader 38 disposed between the pressure vessel 32 and the wall 37 of the subsea power module 24. In an embodiment, the heat spreader 38 is comprised of at least one of copper, aluminum, or similar conductive material. In an embodiment, the heat spreader 38 includes one or more heat pipes 39. The heat spreader 38 effectively provides for the spread of heat 40 from the pressure vessel 32, or electrical components 22, to a larger portion of the wall 37.

In an embodiment, the heat is conducted through the heat spreader 38 and through the wall 37 of the outer pressure compensated vessel 26 and into a surrounding seawater 48 into which the subsea power module 24 is disposed. In another embodiment, a portion of heat 44 is conducted from each of the one or more pressure vessels 32, or directly from the electrical components 22, through the wall 37 of the outer pressure compensated vessel 26, instead of requiring complete dissipation of heat through the dielectric oil 30. In yet another example embodiment, a portion of heat 44 is conducted from each of the one or more pressure vessels 32, or directly from the electrical components 22, via the heat spreader 38, instead of requiring complete dissipation of heat through the wall 37 of the outer pressure compensated vessel 26, a portion of heat 46 generated within each of the one or more pressure vessels 32 may be conducted through the walls of the pressure vessel 32 to the oil in interior chamber 28 and a portion of heat 44 generated within each of the one or more pressure vessels 32 may be conducted through the wall 37 of the outer pressure compensated vessel 26.

In an embodiment, the dielectric oil 30 in the interior chamber 28 may be actively cooled or passively cooled by the lower temperature ambient external fluid (e.g., sea water) through the wall 37 of the outer pressure compensated vessel 26. Thus, the electrical components 22 housed within the one or more pressure vessels 32 that are disposed within the subsea power module 24 may be passively cooled without heat exchanger pipes passing through one or more pressure vessels 32. By coupling the one or more pressure vessels 32, or the one or more electrical components 22, to the wall 37 of the outer pressure compensated vessel 26 and having the heat spreader 38 disposed therebetween, dissipation of the heat 44 is achieved through a larger surface area, which is naturally cooled by the sea water 48. The heat 44 is dissipated from the wall 37 of the outer pressure compensated vessel 26 directly into the sea water 48 surrounding the outer pressure compensated vessel 26. In prior art subsea power modules, the pressure vessels are immersed in a dielectric oil and are cooled by natural convection or by forced convection using a recirculating fan. The oil serves as the electrical insulation between the vessels and the container.

Figure 5:
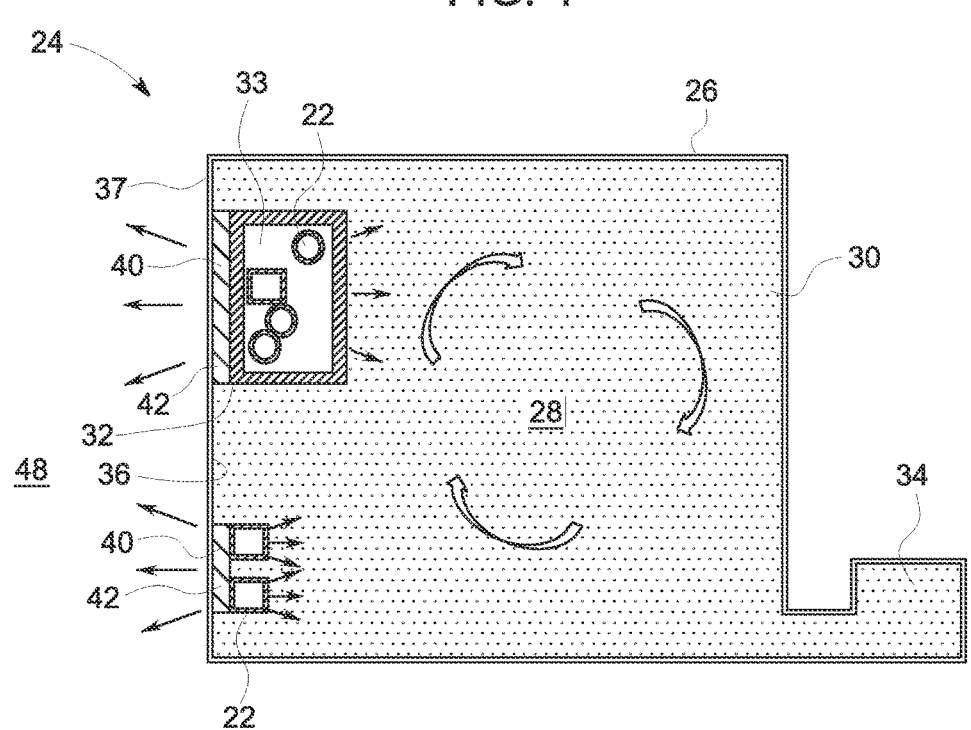
FIG. 5 is a cross-section view of an alternate embodiment of an exemplary subsea power module in accordance with one or more embodiments shown or described herein.

As best illustrated in FIG. 5, the electrical components 22 may be configured so as to not include insulative properties and thus both heat generating and electrically active. Thus, in this particular exemplary embodiment, electrical isolation of the pressure vessel 32 from the sea water 48 and the outer pressure compensated vessel 26 is achieved by disposing a layer of electrically isolative material 40, such as a ceramic material 42, between the pressure vessel 32 and the interior surface 36 of the wall 37 that defines the outer pressure compensated vessel 26, and to which the pressure vessel 32 is coupled. In an embodiment, the ceramic material 42 may be comprised of aluminum nitride (AlN), beryllium oxide (Be), alumina ($Al_2O_3$) and similar materials that include these properties. In an attempt to achieve increased cooling performance this electrically isolative material 40 includes high electrical resistivity properties and is thermal conductive.

Referring now to FIGS. 6-8, illustrated is another exemplary embodiment of a subsea power module 50, generally similar to subsea power module 24 previously described, according to this disclosure for use in assembly 10 (shown in FIG. 1). It should be understood that like elements are indicated with like numbers throughout the drawings. Accordingly, subsea power module 50 includes an outer pressure compensated vessel 26 defining an interior chamber 28. The outer pressure compensated vessel 26 is configured as a pressure compensated enclosure capable of withstanding subsea pressures (e.g. 300 bar). As disclosed in the previous embodiments, the outer pressure compensated vessel 26 is configured to maintain substantially the same pressure within interior chamber 28 as the pressure outside the outer pressure compensated vessel 26. In an exemplary embodiment, a heat generating electrically active pressure vessel 52 is disposed within the interior chamber 28 of the outer pressure compensated vessel 26. In this particular embodiment, the one or more pressure vessels 52 have a generally cylindrical shape. Free space, and more specifically, space not occupied by the pressure vessel 52 is filled with a dielectric oil 30. In the illustrated embodiment, one or more electrical components 22 are housed therein an interior chamber 33 of the one or more pressure vessels 52. In this particular embodiment, the electrical components 22 are configured without any insulative properties and are therefore both heat generating and electrically active. The one or more pressure vessels 52, each having a generally cylindrical shape, are disposed within the interior chamber 28 of the outer pressure compensated vessel 26.

Generally similar to the subsea power module 24 of FIGS. 2-5, the subsea power module 50 includes a passive cooling system. More particularly, each of the one or more pressure vessels 52 are coupled to an interior surface 36 of a wall 37 that defines the outer pressure compensated vessel 26. Electrical isolation of the pressure vessel 52 from the sea water and the outer pressure compensated vessel 26 is achieved by disposing a layer of electrically isolative material 40, such as a ceramic material 42, between the pressure vessel 52 and the interior surface 36 of the wall 37 that defines the outer pressure compensated vessel 26, and to which the pressure vessel 52 is coupled. As previously disclosed, in an embodiment the ceramic material 42 may be comprised of aluminum nitride (AlN), beryllium oxide (Be), alumina ($Al_2O_3$) and similar materials that include these properties. In an attempt to achieve increased cooling performance the electrically isolative material 40 includes high electrical resistivity properties and is thermally conductive. The coupling of the one or more pressure vessels 52 to the interior wall 36 of the outer pressure compensated vessel 26 provides improved cooling for the electrical components 22 and the overall subsea power module 50.

In an embodiment, the electrically isolative material 40 may be configured to extend a length "L" of the pressure vessel 52 to which it is disposed adjacently. In an alternate embodiment, and as best illustrated in FIGS. 6 and 8, the electrically isolative material, illustrated at 40a, may be configured to extend adjacently along at least a portion of the length "L" of the pressure vessel 52, and more particularly configured in segments as illustrated, so as to not extend along the complete length "L" of the pressure vessel 52. Alternatively, the electrically isolative material 40, as previously described, may be configured to extend adjacently along a complete length "L" of the pressure vessel 52.

As best illustrated in FIG. 7, in this particular embodiment, the electrically isolative material 40 (40a) is configured to conform to an exterior shape of the pressure vessel 52. More particularly, the electrically isolative material 40 (40a) conforms to the cylindrical outer shape of the pressure vessel 52, thereby providing increased surface area for the dissipation of heat 44 from within the each of the pressure vessels 52. It should be understood that anticipated by this disclosure is a pressure vessel having any desired geometrical shape and an electrically isolative material configured to conform to the geometrical shape of the pressure vessel so as to provide increase surface area for heat dissipation.

To provide the passive cooling for the electrical components 22, heat 44 is conducted from the pressure vessel 52 through the wall 37 of the outer pressure compensated vessel 26, instead of requiring complete dissipation of heat through the dielectric oil 30. In another embodiment, a portion of heat 46 may be dissipated through the dielectric oil 30. By coupling the pressure vessel 52 to the wall 37 of the outer pressure compensated vessel 26 dissipation of the heat is achieved through a larger surface area, which is naturally cooled by the sea water 48 surrounding the outer pressure compensated vessel 26. The heat is dissipated from the wall 37 directly into the sea water 48 surrounding the outer pressure compensated vessel 26, and more particularly the subsea power module 50.

FIG. 9 is a partial cross-sectional thermal view of a portion of an exemplary subsea power module, such as subsea power module 50, previously described, for use in system 10 (shown in FIG. 1). More particularly, illustrated is the electrically insulative material 40 disposed between a heat generating pressure vessel (52, shown in dashed line) and an interior surface 36 of the wall 37 defining the outer pressure compensated vessel 26. As indicated by the thermal model, the portion of the electrically insulative material 40 closest to the pressure vessel 52 provides for enhanced heat transfer and thus dissipation into the surrounding sea water 48. More particularly, illustrated is the overall resistance from an outer wall of the pressure vessel 52 to the surrounding sea water 48, with 10 mm electrically isolative aluminum nitride (AlN) layer 40 disposed between the pressure vessel 52 and the wall 37 of the outer pressure compensated vessel 26.

Subsea factories are typically installed far from the shore and thousands of meters deep on the sea floor. Accordingly, subsea power modules housing therein heat generating electrical components, as an element of these subsea factories, require a cooling system that must be compact pressure tolerant, and ideally maintenance-free in its lifetime. The largest contribution to the overall thermal resistance between the heat generating electrical components and the sea water occurs between the pressure vessel housing the electrical components and an outer container or vessel into which the pressure vessel is disposed. By coupling the pressure vessel in which the heat generating electrical components are housed, or directly coupling the heat generating electrical components to a wall that defines an outer pressure compensating pressure vessel, the thermal resistance is minimized, thus keeping the temperatures of the electronic devices below their operating limits. Results show that the overall thermal resistance of the power module disclosed herein is approximately 35% less than that of disposing the pressure vessel within dielectric oil without providing for dissipation directly through the wall of the outer pressure compensating vessel. The ability of the disclosed configuration to dissipate heat has been found comparable to that of finned vessels disposed in an oil with a finned interior wall surface. The improved ability to dissipate heat from the heat generating electrical components enables, amongst other benefits, increased power rating and efficiency of the electronics, higher reliability and lifetime of the electronics, orientation free design (pressure vessels can be mounted in any tilt angle without significantly affecting its performance), compactness and smaller footprint (in typical subsea installations, larger component footprint means higher cost and waiting time), ease in manufacture, and minimal to no moving parts.

Exemplary embodiments of the system and device are described above in detail. The system and device are not limited to the specific embodiments described herein, but rather, components of the systems and/or device may be utilized independently and separately from other components and/or steps described herein. For example, the system may also be used in combination with other apparatus, systems, and methods, and is not limited to practice with only the system as described herein. Rather, the exemplary embodiment can be implemented and utilized in connection with many other applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A subsea power module comprising:
   an outer pressure compensated vessel comprising a plurality of walls defining an interior chamber, the outer pressure compensated vessel configured to maintain a pressure within the interior chamber substantially the same as an ambient pressure outside the outer pressure compensated vessel; and
   one or more pressure vessels disposed within the interior chamber of the outer pressure compensated vessel, each of the one or more pressure vessels comprising a plurality of walls defining an air-filled interior chamber, each of the one or more pressure vessels coupled along a substantial length of at least one of the plurality of walls of a respective pressure vessel to an interior surface of at least one of the plurality of walls of the outer pressure compensated vessel defining the interior chamber of the outer pressure compensated vessel, each pressure vessel comprising:
   the air-filled interior chamber configured to maintain a substantially constant pressure within the interior chamber of the pressure vessel; and
   one or more heat generating electrical components disposed within the air-filled interior chamber of the pressure vessel, and
   an electrically isolative material disposed between and in direct contact with the at least one of the plurality of walls defining the interior chamber of the outer pressure compensated vessel and the at least one of the plurality of walls defining the air-filled interior chamber of the one or more pressure vessels, the electrically isolative material disposed so as to extend adjacently along a substantial length of the portion of the pressure vessel coupled to the interior surface of the at least one of the plurality of walls of the outer pressure compensated vessel, wherein the electrically isolative material includes electrical resistivity properties and thermal conductivity properties,
   wherein the subsea module is passively cooled by transferring heat from the one or more heat generating electrical components through the at least one of the plurality of walls defining the one or more pressure vessels, to a single fluid in the interior chamber and through the electrically isolative material, and the at least one of the plurality of walls defining the outer pressure compensated vessel to a seawater surrounding the outer pressure compensated vessel.

2. The subsea power module as claimed in claim 1, wherein the electrically isolative material is a ceramic.

3. The subsea power module as claimed in claim 2, wherein the electrically isolative material is at least one of aluminum nitride (AlN) or beryllium oxide (BeO).

4. The subsea power module as claimed in claim 1, wherein the electrically isolative material extends along at least a portion of a length of the pressure vessel.

5. The subsea power module as claimed in claim 1, wherein the single fluid is a dielectric oil that substantially fills the interior chamber of the outer pressure compensated vessel.

6. The subsea power module as claimed in claim 1, wherein the outer pressure compensated vessel further comprises a pressure compensator.

7. The subsea power module as claimed in claim 1, wherein each of the one or more pressure vessels is configured to transfer heat generated within the air-filled interior chamber of the pressure vessel to the single fluid surrounding the outer pressure compensated vessel.

8. The subsea power module as claimed in claim 7, wherein each of the one or more pressure vessels is further configured to transfer a portion of the heat generated within the air-filled interior chamber of the pressure vessel to a dielectric oil that substantially fills the interior chamber of the outer pressure compensated vessel.

9. An offshore oil and gas installation assembly comprising:

one or more passively cooled subsea power modules housing therein one or more heat generating electrical components, each passively cooled subsea power module comprising:

an outer pressure compensated vessel comprising a plurality of walls defining an interior chamber, the outer pressure compensated vessel configured to maintain a pressure within the interior chamber substantially the same as an ambient pressure outside the outer pressure compensated vessel;

one or more pressure vessels disposed within the interior chamber of the outer pressure compensated vessel, each of the one or more pressure vessels comprising a plurality of walls defining an air-filled interior chamber, each of the one or more pressure vessels coupled along a substantial length of at least one of the plurality of walls to an interior surface of at least one of the plurality of walls defining the interior chamber of the outer pressure compensated vessel, the one or more heat generating electrical components disposed within the one or more pressure vessels; and an electrically isolative material disposed between and in direct contact with the at least one of the plurality of walls defining the interior chamber of the outer pressure compensated vessel and the at least one of the plurality of walls defining the air-filled interior chamber of the one or more pressure vessels, the electrically isolative material disposed so as to extend adjacently along a substantial length of the portion of the pressure vessel coupled to the interior surface of the at least one of the plurality of walls of the outer pressure compensated vessel, wherein the electrically isolative material includes electrical resistivity properties and thermal conductivity properties and is at least one of aluminum nitride (AlN) or beryllium oxide (BeO), wherein each of the one or more heat generating electrical components is configured to transfer heat through the at least one of the plurality of walls defining the air-filled interior chamber of the one or more pressure vessels to a single fluid in the interior chamber and through, the electrically isolative material, and the at least one of the plurality of walls defining the outer pressure compensated vessel to a seawater surrounding the outer pressure compensated vessel so as to passively cool the one or more passively cooled subsea power modules.

* * * * *